(12) United States Patent
Van Asselt et al.

(10) Patent No.: US 10,352,551 B2
(45) Date of Patent: Jul. 16, 2019

(54) LED MODULE AND METHOD OF SEALING

(71) Applicant: SIGNIFY HOLDING B.V., Eindhoven (NL)

(72) Inventors: Robert Van Asselt, Eindhoven (NL); Mark Johannes Antonius Verhoeven, Eindhoven (NL); Joris Jan Vrehen, Eindhoven (NL); Gerardus Franciscus Cornelis Maria Lijten, Eindhoven (NL); Laurens Bax, Eindhoven (NL); Chris Van Den Eerenbeemd, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/548,025

(22) PCT Filed: Jan. 25, 2016

(86) PCT No.: PCT/EP2016/051413
§ 371 (c)(1),
(2) Date: Aug. 1, 2017

(87) PCT Pub. No.: WO2016/124429
PCT Pub. Date: Aug. 11, 2016

(65) Prior Publication Data
US 2018/0017247 A1    Jan. 18, 2018

(30) Foreign Application Priority Data
Feb. 5, 2015    (EP) .................................. 15153981

(51) Int. Cl.
*F21K 9/90*    (2016.01)
*F21V 3/02*    (2006.01)
(Continued)

(52) U.S. Cl.
CPC .............. *F21V 31/005* (2013.01); *F21K 9/90* (2013.01); *F21V 3/02* (2013.01); *F21V 17/06* (2013.01);
(Continued)

(58) Field of Classification Search
CPC .......... F21V 31/005; F21V 3/02; F21V 17/06; F21V 17/101; F21V 19/0015; F21K 9/90; H05K 1/056; H05K 3/284
(Continued)

(56) References Cited

U.S. PATENT DOCUMENTS 6,259,157 B1 * 7/2001 Sakamoto ............. H01L 23/373
257/706
8,035,118 B2 * 10/2011 Kususe ................... H01L 24/06
257/90
(Continued)

FOREIGN PATENT DOCUMENTS

CN    202382169 U    8/2012
CN    202915197 U    5/2013
(Continued)

*Primary Examiner* — Bryon T Gyllstrom

(57) ABSTRACT

This invention relates to the field of lighting modules employing light emitting diodes (LEDs), and more particularly to LED modules suitable for exposed lens plate luminaires. There is herein provided an LED module having a printed circuit board comprising at least two layers, wherein the interface between two layers at a side surface of the printed circuit board is covered by a protrusion of an optically transmissive cover plate. The same said optically transmissive cover plate is also adapted to cover at least one LED positioned in or on the printed circuit board.

13 Claims, 8 Drawing Sheets

(51) Int. Cl.
*H05K 1/05* (2006.01)
*H05K 1/18* (2006.01)
*H05K 3/28* (2006.01)
*H05K 3/30* (2006.01)
*F21V 17/06* (2006.01)
*F21V 17/10* (2006.01)
*F21V 19/00* (2006.01)
*F21V 31/00* (2006.01)
*F21Y 115/10* (2016.01)

(52) U.S. Cl.
CPC ........ *F21V 17/101* (2013.01); *F21V 19/0015* (2013.01); *H05K 1/056* (2013.01); *H05K 3/284* (2013.01); *F21Y 2115/10* (2016.08); *H05K 1/181* (2013.01); *H05K 3/28* (2013.01); *H05K 3/303* (2013.01); *H05K 2201/09154* (2013.01); *H05K 2201/10106* (2013.01); *H05K 2201/10522* (2013.01); *H05K 2203/1147* (2013.01); *H05K 2203/1316* (2013.01); *H05K 2203/1327* (2013.01)

(58) Field of Classification Search
USPC ..................................................... 362/249.02
See application file for complete search history.

(56) References Cited

U.S. PATENT DOCUMENTS

| | | | |
|---|---|---|---|
| 8,101,434 B2* | 1/2012 | Guillien | F21V 5/04 257/E21.499 |
| 9,188,314 B2* | 11/2015 | Wu | F21V 15/01 |
| 2011/0315956 A1* | 12/2011 | Tischler | H01L 23/4985 257/13 |
| 2012/0218757 A1* | 8/2012 | Gill | F21V 15/015 362/235 |
| 2013/0088863 A1* | 4/2013 | Park | F21V 29/004 362/218 |
| 2014/0268606 A1* | 9/2014 | Chen | H05K 3/284 361/760 |

FOREIGN PATENT DOCUMENTS

| | | |
|---|---|---|
| DE | 102010029515 A1 | 12/2011 |
| KR | 1284261 B1 | 7/2013 |
| WO | 2011023927 A1 | 3/2011 |
| WO | 2012029002 A1 | 3/2012 |

\* cited by examiner

LED MODULE AND METHOD OF SEALING

CROSS-REFERENCE TO PRIOR APPLICATIONS

This application is the U.S. National Phase application under 35 U.S.C. § 371 of International Application No. PCT/EP2016/051413, filed on Jan. 25, 2016 which claims the benefit of European Patent Application No. 15153981.4, filed on Feb. 5, 2015. These applications are hereby incorporated by reference herein.

FIELD OF THE INVENTION

This invention relates to the field of lighting modules employing light emitting diodes (LEDs), and more particularly to LED modules suitable for exposed lens plate luminaires. The invention further relates to a method of sealing a LED module.

BACKGROUND OF THE INVENTION

Exposed lens plate luminaires typically comprise LED modules mounted in a housing or supporting mechanism with no additional shielding or protection provided to the light emitting surface of the LED module. As such, an exposed lens plate luminaire may have fewer parts than other lighting arrangements, resulting in a lower cost luminaire with increased light output and an improved beam profile.

Known LED modules employed in exposed lens plate luminaires comprise an LED light source; an optically transmissive element (such as a lens plate) and an electrical connection element. Optionally, such LED modules are known to further comprise additional thermal management elements, e.g. a heat sink. The LED light source typically comprises a printed circuit board (PCB) with a plurality of LEDs mounted thereon, said LEDs being adapted to output light from a light-emitting surface of the printed circuit board. Due to the absence of a protective element, the LED module itself should preferably be self-sealing to prevent the ingress of foreign contaminants such as dust or water, in accordance with IP66 and IP67.

One known solution to this issue comprises sealing the optical plate to a heat sink positioned on a non-light-emitting surface of the LED light source (i.e. a surface on the reverse of the LED light source, opposite and parallel to the light emitting surface). Another known method is to extend the optical plate around the LED light source to the non-light-emitting surface of said light source and seal the optical plate thereon. However, this requires a dedicated housing to mount these modules, needing to accommodate the parts of the optical plate that extend to this the reverse surface. Other modules may comprise sealing the optical plate to the light-emitting surface of the LED module; however, this may cause a reduction in the optical efficiency of the LED module.

US2013088863A1 discloses a LED module comprising LEDs mounted on a MCPCB which is inserted into a transparent, cylindrical cover, covering a portion of the interface between layers at a side surface of the MCPCB.

SUMMARY OF THE INVENTION

The invention is defined by the claims.

According to an aspect of the invention, there is provided an LED module comprising: a printed circuit board having an upper surface and at least one side surface, the printed circuit board comprising: a first layer; a second layer; and a plurality of LEDs adapted to output light from the upper surface; and an optically transmissive cover plate positioned to cover at least one of the plurality of LEDs and having at least one protrusion arranged to cover a portion of an interface between the first layer and the second layer at the side surface of the printed circuit board wherein at least one side surface of the printed circuit board is at least partially inwardly inclined.

Proposed embodiments may therefore be sealed, for example by a sealant, to prevent ingress of foreign contaminants between the layers of the PCB. In other words, by covering a portion of an interface between the first layer and the second layer at the side surface of the printed circuit board, the covered portion of the interface between the first layer and the second layer may be protected from contaminants such as water, dust or other particles. Hence, a portion or portions of the interface which otherwise would be directly exposed to the environment (ambient or surrounding atmosphere), for example the portion of the interface at the sides of the first and second layer, are sealed from said environment to prevent ingress. More preferably, all of the portion or portions of the interface which otherwise would be directly exposed to the environment, is/are sealed from said environment by the sealant.

Proposed embodiments thus provide an LED module or luminaire having a printed circuit board (PCB) and an optically transmissive cover plate. The PCB may comprise two or more layers and a plurality of LEDS adapted to emit light. The PCB may be considered to have an upper surface from which light is output. The printed circuit board may also have at least one side surface, whereat an interface between the first layer and the second layer is present. Put another way, there may be a boundary in the printed circuit board between the first and second layer, wherein the boundary may be exposed to at least one side surface of the printed circuit board.

At least one side surface of the printed circuit board is at least partially inwardly inclined. In other words, the printed circuit board is fully or partially tapered, such that the light-outputting upper surface of the printed circuit board may be of a smaller area than a lower surface of the printed circuit board. That is to say, a side surface of the printed circuit board may be inclined partially inwardly of the printed circuit board.

In some embodiments, the first layer may comprise metal substrate and the second layer may comprise a dielectric material.

The plurality of LEDs may, for example, be distributed in any of the two or more layers or be positioned on the upper surface of the printed circuit board. The LEDs may be arranged to emit light such that the light is output from the upper surface of the printed circuit board.

The optically transmissive cover plate is configured so that it covers at least one of the plurality of LEDs, and hence the cover plate may at least partially cover the upper surface of the printed circuit board. Examples of such a plate may include: a flat plane of optically translucent material; a curved dome of translucent material; or a windowed sheet of material. It may be understood that an optically transmissive cover plate may comprise material that permits at least partial transmittance of light emitted from the LEDs, output via the upper surface. Alternatively, the cover plate may comprise any windowed material, such that light is permitted to at least partially permeate through the cover plate.

Optionally, both the upper surface of the printed circuit board and a surface of the optical plate may be substantially flat, such that the upper surface of the printed circuit board and the said surface of the optical plate may lie flush against one another.

The cover plate comprises a protrusion that covers a section of the interface between a first and second layer at the at least one side surface of PCB. In other words, at least one side surface, to which the boundary between the first layer and second layer is exposed, may be partially covered by the protrusion, such that part or all of the boundary exposed to the side surface is covered by the protrusion. There may be embodiments wherein the optical plate comprises a plurality of protrusions, each protrusion covering a portion of any such interfaces exposed to any side surfaces of the printed circuit board. The side surfaces may be outwardly facing side surfaces or may be inwardly facing side surfaces. In other words, the side surfaces may be at an outer/peripheral edge of the PCB or at an inner edge PCB (e.g. an edge formed within the footprint area of the PCB when viewed from above. Such an edge may therefore define an aperture or hole in the PCB.

The protrusion may otherwise be understood to be a projection, flange or an outthrust that extends at an angle from the plane of the optical plate. The protrusion may therefore define an angle with the cover plate, and the angle may, for example, be substantially equal to 90°. In some embodiments, the protrusion of the optical plate may be of a different material to other parts of the optical plate.

In some embodiments, the protrusion may be provided at the edge of the optical plate, such that the optical plate may have, for example, an at least partially raised lip around its perimeter.

In some embodiments, the cover plate may be attached to the printed circuit board by an overmolding or 2k molding process. In this manner, the covered portion of the interface between a first and second layer may be effectively sealed against foreign contaminants.

In other embodiments, a plastic or plastic-like material, preferably silicone rubber, may be overmoulded on the upper surface of the printed circuit board to seal the cover plate to the printed circuit board. Alternatively a plastic material may be moulded over both the cover plate and the printed circuit board to attach the cover plate to the printed circuit board and thereby seal at least the covered portion of the interface against foreign contaminants.

In an embodiment, there may be provided an optically transmissive cover plate for a printed circuit board, wherein the circuit board comprises an upper surface; at least one side surface; a first layer; a second layer; and a plurality of LEDs adapted to output light from the upper surface. The cover plate is capable of being positioned to at least partially cover the upper surface such that at least one of the plurality of LEDs is covered. The said cover plate comprises a protrusion adapted to cover a portion of an interface between the first layer and the second layer at a side surface. Thus, embodiments may provide a cover plate that can be supplied separately from the LED module.

Optionally, the LED module is adapted to further comprise sealant positioned between the protrusion of the optical plate and the covered portion of the interface so as to prevent ingress of foreign contaminants into the said covered portion of the interface.

In other words, there may be provided sealant between the protrusion of the optical plate and the covered portion of the interface on the side of the printed circuit board. Thus, the interface may be at least partially sealed against the ingress of foreign contaminants, such as dust or water.

Put another way, an edge side of the printed circuit board may be at least partially covered by at least one protrusion of the optically transmissive cover plate. Accordingly, the edge interface between two layers of the printed circuit board at the said edge side may also be partially covered by the said at least one protrusion. Sealant, positioned between the protrusion and the interface, helps prevents penetration of external or foreign contaminants at the said covered interface between the printed circuit board layers. Examples of foreign contaminants may comprise: particles of dust; moisture; or corrosive gases. Such a sealant may therefore hermetically seal the cover plate to the printed circuit board. One example of a possible sealant is silicone material.

In an embodiment, the sealant may be adhesive so as to adhere the protrusion of cover plate to the covered portion of the interface. That is to say, the area of the side surface covered by the protrusion of the optical plate may be adhered to the said protrusion by adhesive sealant. Adhering the optical plate to the printed circuit board on the side surface may reduce optical losses that may be incurred when sealing a printed circuit board with an optical plate on the upper surface. One example of a possible adhesive sealant is silicone glue.

There is provided an optically transmissive cover plate for a printed circuit board, wherein the circuit board comprises an upper surface; at least one side surface; a first layer; a second layer; and a plurality of LEDs adapted to output light from the upper surface. The cover plate is capable of being positioned to at least partially cover the upper surface such that at least one of the plurality of LEDs is covered. The said cover plate comprises a protrusion adapted to cover a portion of an interface between the first layer and the second layer at a side surface. Sealant may then be provided in-between the protrusion and the printed circuit board to provide effective sealing against exposure. Thus, embodiments may provide a cover plate with sealant that can be supplied separately from to the LED module The optical plate may further comprise at least one depression alongside each protrusion of the optical plate.

There may therefore be provided a depression in the optical plate, for example, a trench or channel, adjacent to the protrusion. The depression may be partially or wholly in line the side edge of the printed circuit board. The depression may be a groove that runs alongside the whole length of the protrusion or may only run alongside a partial length of the protrusion. The depression may be understood to be situated next to a side of the protrusion. Preferably, the depth of the depression in the optical plate is greater than 0.5 mm.

Sealant positioned between the protrusion and the printed circuit board may be extended to also be positioned between the depression of the cover plate and the printed circuit board for sealing the cover plate to the printed circuit board. The sealant may therefore partially seal an area of the upper surface of the printed circuit board to the optical plate. The sealant may, in some embodiments, not extend beyond the depression, such that the printed circuit may lie flush against with the optical plate.

The sealant may further be adhesive such that the printed circuit board may be attached to the cover plate by means of the adhesive sealant.

In some embodiments there may be a plurality of depressions alongside at least one protrusion of the optical plate. In such embodiments sealant, provided to the depressions, may be trapped in one of the plurality of depressions to prevent flow of sealant towards, for example, LEDs positioned on the upper surface of the printed circuit board.

The protrusion of the optical plate may have at least one inclined side. In other words the protrusion may partially or fully taper from the bottom (i.e. closest to the optical plate) to the tip (i.e. away from the optical plate). The inclined side may be that side of the protrusion closest to the printed circuit board, and in some embodiments may incline away from the said printed circuit board. In such an embodiment, a lower part of the protrusion may be more proximate to the printed circuit board than a upper part of the protrusion.

In some embodiments, both the protrusion and the printed circuit board are inclined such that the proximity of an upper part of the protrusion and a lower part of the protrusion to the printed circuit board is the same.

The at least one layer of the printed circuit may be at least partially absent in the locality of the protrusion In other words, in an embodiment, the first layer may laterally extend beyond the second layer of the printed circuit board, such that a (non-inclining) protrusion is more proximate to the first layer than the second layer. Sealant may still cover the edge interface between the first and second layer at area of the side of the printed circuit board to which the second layer extends. In alternative embodiments the second layer may laterally extend beyond the first layer of the printed circuit board. Thus in such embodiments, the side surface of the second layer and the side surface of the first layer may not be in the same plane.

In some embodiments, the second layer, which may, for example, have been deposited to fully coat the first layer, may be stripped in the immediate vicinity of the protrusion of the cover plate. In another embodiment, the second layer may have been selectively deposited upon the first layer so as to not extend fully to the perimeter of the first layer.

In some embodiments, the partial absence of the layer of the printed circuit board, i.e. that which is at least partially absent in the locality of the protrusion, may not be directly at the edge of the said printed circuit board. For example, the second layer may be partially stripped inward to the printed circuit board, such that there is a side surface of the second layer and a side surface of the first layer in the same plane. There may thus be an interruption or gap in the second layer of the printed circuit board. In alternative embodiments, the first layer may be partially stripped inward to the printed circuit board.

Optionally, each side surface of the printed circuit board is covered by at least one protrusion of the optical plate to such an extent that the interface between the first layer and second layer of the printed circuit board at each side surface is fully covered. Sealant may be provided to seal the optical plate to the printed circuit board. In such an embodiment, it may be considered that the entire upper surface of the printed circuit board is protected against foreign contaminants.

In some embodiments, the cover plate may comprise additional protrusions that are not arranged to cover a portion of an interface. Contrarily, such additional protrusions of the cover plate may be arranged to cover an area of the upper surface of the printed circuit board. Sealant positioned therebetween may thereby seal the cover plate to the upper surface of the printed circuit board to protect ingress of foreign contaminants across the upper surface of the printed circuit board. Thus such additional protrusions may be called upper surface sealing protrusions.

Optionally, the cover plate may comprise only a single, continuous protrusion that may vary in outward extent or height from the cover plate to be sealed to selected side surfaces of the printed circuit board and selected sections of the upper surface of the printed circuit board. Such a single, continuous protrusion may alternatively only seal at some or all of the side surfaces. This latter continuous protrusion may, therefore, not vary in outward extent from the cover plate.

In an embodiment, the optical surface plate may be partially sealed to at least one side surface and partially sealed to the upper surface such that an area of the upper surface may be protected against the ingress of foreign contaminants.

In order to electrically connect the LEDs mounted on the printed circuit board to an external contact, such as a power supply, there may be a requirement for wires to be provided to the LEDs through the optical plate. Thus, there is herein introduced a technique for allowing wires to feed through the optical plate without exposing the upper surface of the printed circuit board to foreign contaminants.

Therefore, in some embodiments, there may be provided a cavity that spans through a protrusion, for example a side interface covering protrusion or an upper surface sealing protrusion, from outside the LED module in the direction of the printed circuit board. The cavity may be thought to be a channel or groove cut into such a protrusion. A wire may be positioned in said channel, encapsulated in sealant. Optionally, the sealant does not expand outside the channel. Preferably the sealant does not expand outside the channel, but rather completely fills said channel.

Optionally there may be provided at least two of such cavities to enable, for example, the provision of a power supply and a reference ground. Preferably there are no more than four of the said cavities to allow, for example, the provision of a power supply; a reference ground; and two additional control signals (such as a dimming control).

There may be required a manner of mechanically fixing the optical plate to the printed circuit board; and a manner of mechanically fixing the LED module disclosed herein to an external support (such as a ceiling). There is provided a plug for mechanical fixation of the optical plate to the printed circuit board and for mounting the LED module into an external support. For mounting of an LED module, there may be provided an external support or housing that may act as a heat sink.

In the main body of the printed circuit board and the optical plate, that is to say inward of the perimeter, the printed circuit board and the optical plate may be thought to lie substantially parallel against one another, preferably with a small gap (e.g. Less than 5 mm) between them. To mount such an embodiment of an LED module to an external support, there is provided a plug that spans through the printed circuit board and the optical plate. It is desirable that when mounted to said external support by the plug (for example a ceiling or wall), the printed circuit board may lie against the external support, with the optical plate lying against the printed circuit board. To provide improved heat sink capabilities, the plug preferably does not extend beyond the bottom surface of the printed circuit board, said bottom surface being the side of the printed circuit board lying against the external support, and opposite to the upper surface that is covered by the optical plate. Typical plugs may allow a securing fastener, such as a screw, to pass through from the optical plate, through the printed circuit board and into the external support for mounting and securing of the LED module thereon.

One exemplary plug for mechanical fixation of the LED module may comprise a clamp that fixes into the printed circuit board for securing the LED module to the plug. In such embodiments of this plug, clamping may only be performed in a single direction only (e.g. along the length of the printed circuit board) such that dimensional variations of the LED module (such as those caused by temperature changes or manufacturing tolerances) may be accounted for. By protecting against variations in this manner, the risk of accidental stresses, which may cause damage to the LED module, may be somewhat mitigated.

The plug may further comprise a press module that, when the plug is secured to the external support, pushes the printed circuit board against said external support. For example, a screw might lie directly against the press module such that when the screw secures the plug into the external support the bottom surface of the printed circuit board is pushed against the external support by the press module. By pushing the printed circuit board against the external support, good flatness of the LED module to the external support may be achieved, which may enable good thermal contact of the printed circuit board to the external support. This may improve module performance and reliability by providing a heat sink for the printed circuit board. Preferably, direct pressure is not placed on the optical plate to be transferred to the printed circuit board, as this may result in less robust contact between the printed circuit board and the heat sink provided by the external support. Furthermore, applying such a direct pushing force on the optical plate may increase the chance of cracking and damage of said optical plate.

Optionally, a plug may comprise wing-like projections that span over an externally exposed surface of the optical plate, said wing-like projections being adapted to push the optical plate toward the printed circuit board. A wing-like projection, alternatively named a wing, may optionally comprise a protrusion to be secured into the optical plate. The wings may allow for movement of the optical plate along the length and width directions of the optical plate, whilst maintaining a constant relative distance from the printed circuit board (i.e. restricting movement in the depth direction of the optical plate).

According to another aspect of the inventions, there is provided a method of sealing an LED module, wherein said LED module comprises a printed circuit board having a upper surface and at least one side surface and comprising: a first and second layer; and a plurality of LEDs adapted to output light from the upper surface, the method comprising: providing an optically transmissive cover plate comprising a translucent material positioned to cover at least one of the plurality of LEDs, wherein the cover plate comprises: at least one protrusion arranged to cover a portion of an interface between the first layer and the second layer at the at least one side surface of the printed circuit board and wherein the printed circuit board of the LED module is made to have at least one inwardly inclining side.

The method may further comprise providing adhesive sealant between the protrusion of the cover plate and the covered interface so as to prevent ingress of foreign contaminants into the section of the interface between the first layer and the second layer covered by the covered area.

The method may further comprise: providing at least one depression in the optical plate alongside each protrusion; providing the adhesive sealant in the depression of the optical plate for adhesion of the optical plate to the printed circuit board.

The step of providing an optical plate may be adapted such that the protrusion has at least one inclined side.

Optionally, the method may be adapted such that the second layer of the printed circuit board of the LED module is at least partially absent in the locality of the protrusion.

These and other aspects of the invention will be apparent from and elucidated with reference to the embodiment(s) described hereinafter.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an LED module having a cover plate, wherein the cover plate is adapted to cover an interface between two layers of a printed circuit board adapted to output light.

Figure 1:
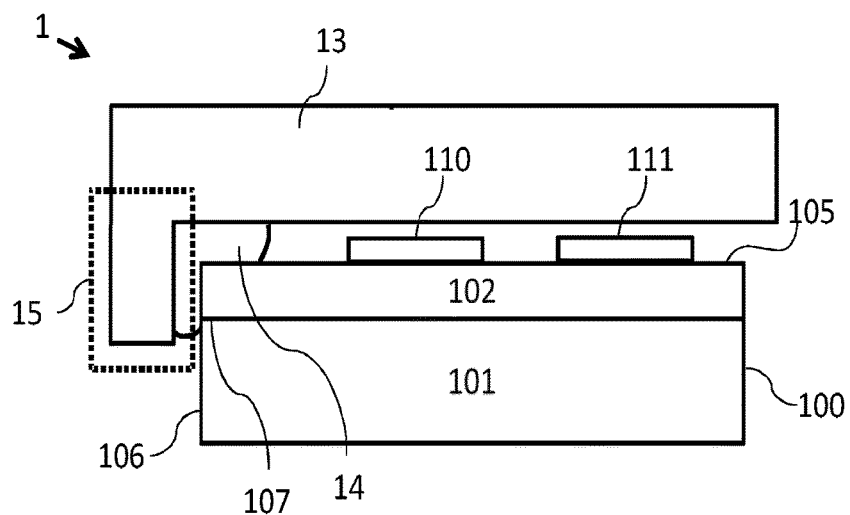
FIG. 1 shows an LED module according to a first exemplary embodiment.

With reference to FIG. 1, a first embodiment of an LED module 1 is shown. The LED module 1 comprises a printed circuit board (PCB) 100, having a first layer 101 and a second layer 102, and a cover plate 13. There is mounted on the upper surface 105 of the PCB a first LED 110 and a second LED 111, adapted to output light from the upper surface 105 when the LED module is in use. The cover plate 13 is arranged to cover at least one of these mounted LEDs, for example, both the first 110 and second 111 LED.

The cover plate 13 comprises a protrusion 15 that extends outwardly from the cover plate. The protrusion 15 is arranged to cover a portion of the interface 107 between the first layer 101 and the second layer 102, especially at a side surface 106 of the printed circuit board 100, i.e. that part of the interface which otherwise would be exposed to the ambient or surrounding atmosphere. In this and subsequent embodiments, the protrusion 15 is shown at the edge of the cover plate 13, however, it will be understood that a protrusion is not necessarily limited to being provided at the perimeter but may, for example, be provided inward of the perimeter of the cover plate 13.

Sealant 14 is positioned between the cover plate 13 and the portion of the interface 107 covered by the protrusion 15 of the cover plate. In the present embodiment, the sealant 14 extends to partially cover the upper surface of the printed circuit board 100. By sealing the cover plate to the printed circuit board with sealant in this manner, the portion of the interface 107 covered may be sealed to prevent ingress of foreign contaminants. Thus, the interface between the first layer 101 and the second layer 102 may be protected from contaminants such as water, dust or other particles.

Optionally, the sealant may be adhesive so as to stick the optical plate to the PCB 100.

The first layer 101 may be a substrate, such as an metal substrate (e.g. aluminium). The second layer 102 may be a dielectric material (e.g. silicon) upon which a LED may be formed or mounted. The second layer 102 may in some other embodiments be an epoxy or polyimide material. The layers may otherwise or additionally comprise other materials, such as epoxy impregnated glass fabric or even an electrically insulating material with integrated copper tracks.

Figure 2:
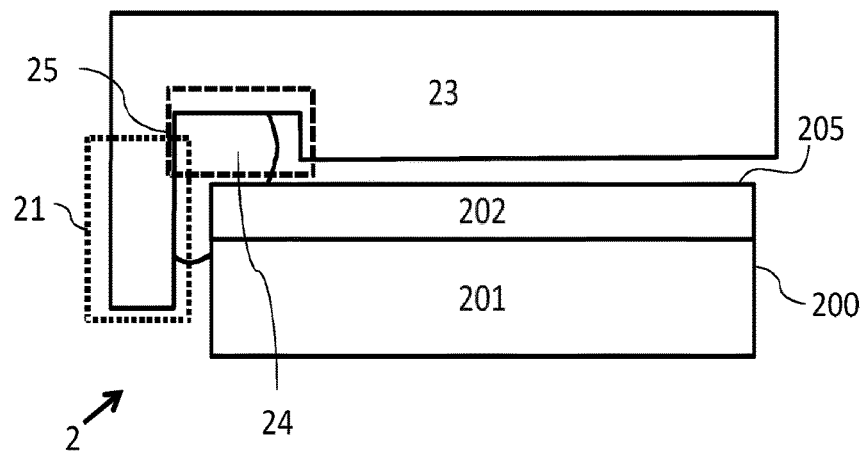
FIG. 2 illustrates an LED module according to a second exemplary embodiment.

A second embodiment of an LED module 2 is shown in FIG. 2. The LED module 2 similarly comprises a PCB 200, having a first layer 201 and a second layer 202, and a cover plate 23. The cover plate 23 is arranged to cover at least one LED (not shown) mounted on the upper surface 205 of the printed circuit board 200.

As in the first embodiment, the cover plate 23 comprises a protrusion 21 arranged to cover a portion of the interface between the first layer 201 and the second layer 202. Sealant 24 is positioned between at least the protrusion 21 of the cover plate 23 and the PCB 200 to seal the covered portion of the interface against foreign contaminants.

In this second embodiment, the cover plate 23 further comprises a depression 25 alongside the protrusion 21. The depression 25 may be a groove in the cover plate 23 that runs alongside the length of the protrusion 21. The sealant 24 is extended to at least partially fill the depression 25 so as to seal the cover plate to the upper surface of the printed circuit board. The provision of a depression 25, alternatively named a channel, in this manner may accommodate relative movement between the optical plate and the printed circuit board when the LED module is in use.

Figure 3:
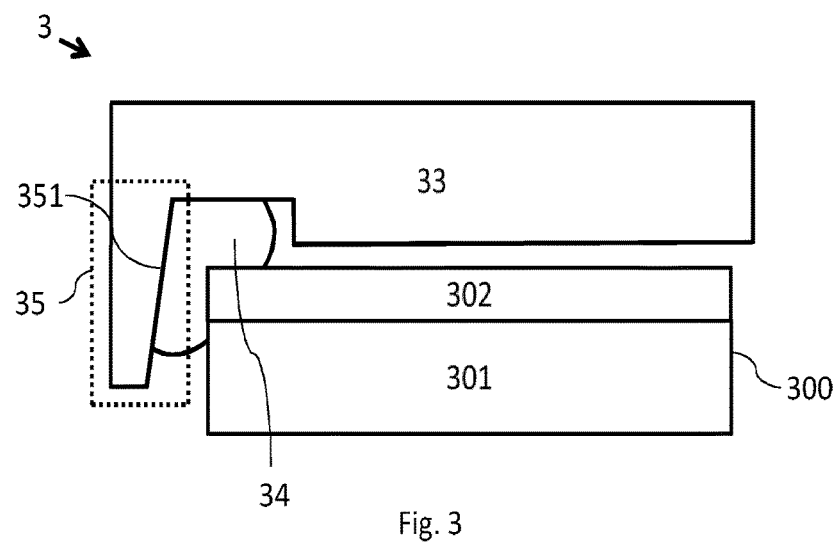
FIG. 3 displays an LED module according to a third exemplary embodiment.

A third embodiment of an LED module 3 is illustrated in in FIG. 3. The LED module 3 comprises the same features as the second embodiment exhibited in FIG. 2. That is to say, a PCB 300, having a first layer 301 and a second layer 302, wherein the interface between the said two layers is covered by a protrusion 35 of a cover plate 33. Sealant 34 positioned between the cover plate 33 and the printed circuit board helps prevent ingress of foreign contaminants into the covered portion of the interface.

In the present embodiment, however, a side 351 of the protrusion 35 of the cover plate 33 is partially inclined. In other words, the protrusion 35 slightly tapers in the direction away from the body of the optical cover 33. To incline the protrusion in this manner may enable the sealant 34 to be positioned with greater ease.

Figure 4:
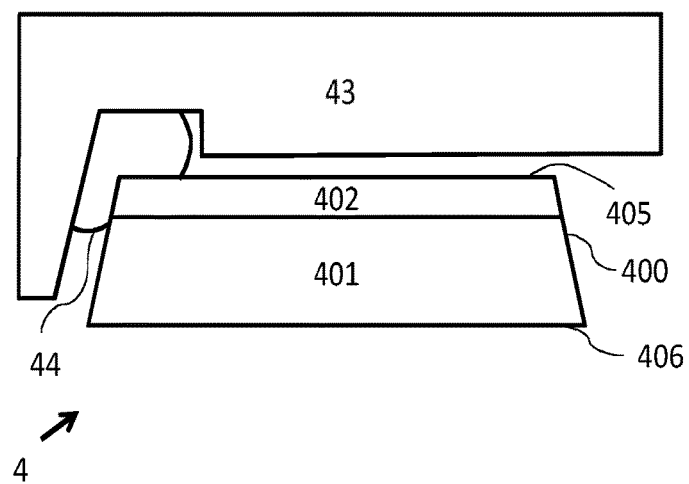
FIG. 4 depicts an LED module according to a fourth exemplary embodiment.

Another embodiment of an LED module 4, shown in FIG. 4, comprises all the features of the third embodiment exhibited in FIG. 3. In other words, an inclined protrusion of an optical plate 43 is arranged to cover an interface formed between a first layer 401 and second layer 402 of a PCB 400. Sealant 44 is positioned between the optical plate 43 and the PCB 400 to seal the aforementioned interface from foreign contaminants.

In this fourth embodiment, the edges of the PCB 400 are inwardly inclined, that is to say at least partially inclined in the direction of the body of the printed circuit board. Thus the area of the upper surface 405 of the PCB 400 may be smaller than the area of a lower surface 406 of the printed circuit board. Providing an inclined side of the printed circuit board in this manner may permit improved sealant flow during provision of the said sealant.

Figure 5A:
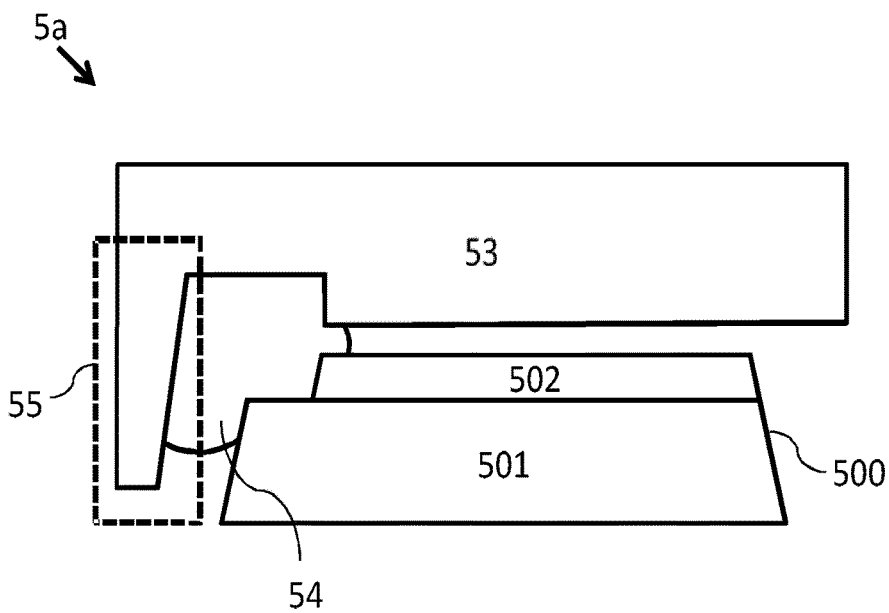
FIG. 5a illustrates an LED module according to a fifth exemplary embodiment.

In a fifth embodiment of the LED module 5a, illustrated by FIG. 5a, the features of the fourth embodiment are present. Thus, the PCB 500 comprises a first layer 501 and a second layer 502. The interface formed at the edge of the printed circuit board between the first layer 501 and the second layer 502 is at least partially covered by a protrusion 55 of an optical plate 53. Sealant 54 is positioned between at least a protrusion 55 and the edge of the printed circuit board such that the interface between the first 501 and second 502 layer is at least partially sealed against the admission of contaminants between the layers. In this specific case where part of the layer 502 is removed, it is not necessary that the protrusion 55 or the sealant extends to the side of the PCB. They can also be restricted to the top surface to be directly connected to the metal of the PCB.

The second layer 502 of the fifth embodiment is adapted to be partially absent in the locality of the protrusion 55. In some embodiments, therefore, the second layer 502 may be partially removed in the immediate vicinity of the protrusion 55. Thus the second layer 502 of the PCB 500 may be partially absent towards the edge or perimeter of the printed circuit board 500. The partial absence of the second layer may allow for improved sealing of the cover plate to the first layer, which may, for example, be stuck by adhesive sealant with greater adherence than the second layer.

Figure 5B:
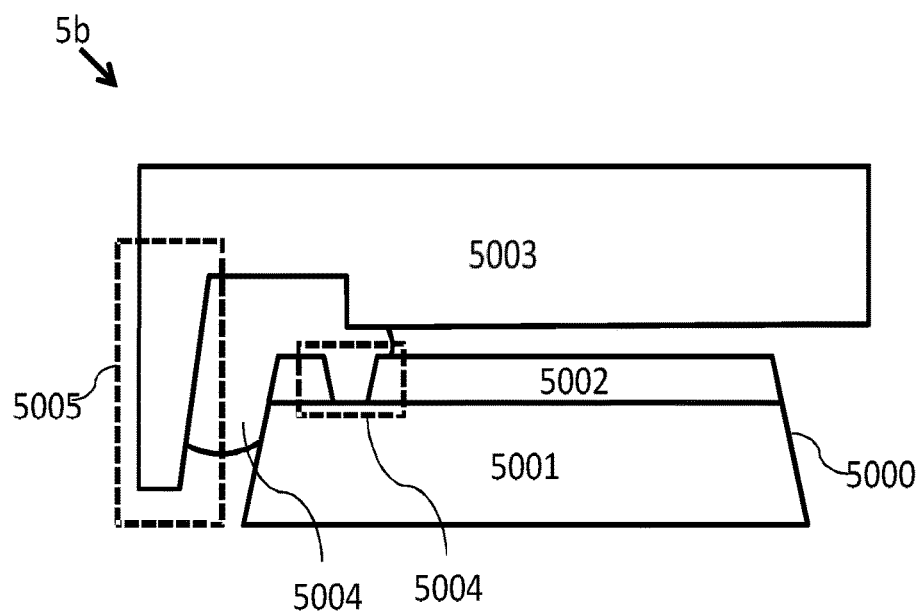
FIG. 5b illustrates an LED module according to a sixth exemplary embodiment.

Another embodiment of an LED module 5b is shown in FIG. 5b. Similar to the fifth embodiment of FIG. 5a, the LED module comprises a printed circuit board 5000 comprising a first layer 5001 and a second layer 5002. An optical cover plate 5003 is arranged to cover at least one LED (not shown) positioned on the top of the second layer 5002. A protrusion 5005 of the optical cover plate 5003 is arranged to cover the interface between the first layer 5001 and the second layer 5002. Sealant is positioned between the first layer 5001 and the second layer 5002 to sealably adhere the optical cover plate to the printed circuit board.

The second layer 5002 of the present embodiment is adapted to be partially absent in the locality of the protrusion 5005. In the present embodiment the absence 5004 of the second layer 5002 is partially inward to the printed circuit board 5000. The partial absence of the second layer may allow for improved sealing of the cover plate 5003 to the first layer 5001, which may, for example, be stuck by adhesive sealant 5004 with greater adherence than the second layer 5002.

Figure 6:
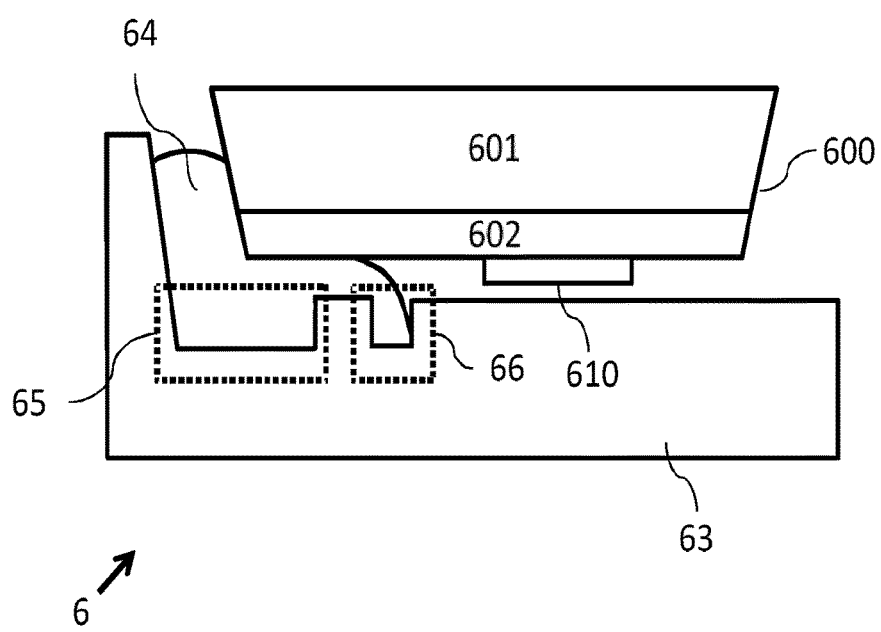
FIG. 6 displays an LED module according to a seventh exemplary embodiment.

A seventh embodiment of an LED module 6 is shown in FIG. 6. Again, the LED module comprises a printed circuit board 600 covered at an edge by a protrusion of an optical plate 63 such that an interface between a first 601 and second 602 layer is at least partially covered. An LED 610, positioned on an upper surface of the printed circuit board 600, is covered by the optical plate 63. A first depression 65 is present in the optical plate 63 alongside the protrusion.

The optical plate 63 further comprises a second depression or channel 66 alongside the first depression 65. In the event that sealant 64 of a sufficiently low viscosity may otherwise flow into the flat area of the printed circuit board a second depression 66, for example a groove or channel in the optical plate, can function as a trap to prevent flow towards the LEDs, for example the LED 610.

Figure 7:
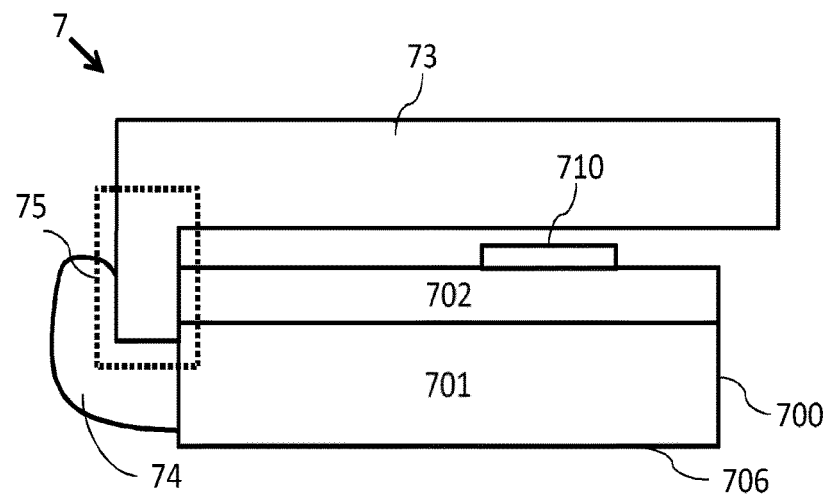
FIG. 7 shows an LED module according to an eighth exemplary embodiment.

With reference to FIG. 7, an eighth embodiment of an LED module 7 may be seen. The LED module comprises a PCB 700 having a first layer 701 and a second layer 702. An LED 710 is mounted upon the upper surface of the printed circuit board adapted to emit light. An optical plate 73, positioned to cover the LED 710, comprises a protrusion 75 arranged to cover the interface between the first 701 and second layer 702 at the edge of the PCB 700.

A sealing mould 74, made of a plastic material such as silicone rubber, is attached to both the PCB 700 and the protrusion 75 of the optical plate 73. The sealing mould may be attached by a known overmolding or a known 2k molding process. Thus, the portion of the interface covered by the protrusion 75 between the first 701 and second layer 702 may be sealed against the ingress of foreign contaminants by the sealing mould 74. Preferably the sealing mould 74 does not extend to cover the lowermost surface 706 of the PCB 700.

Figure 8:
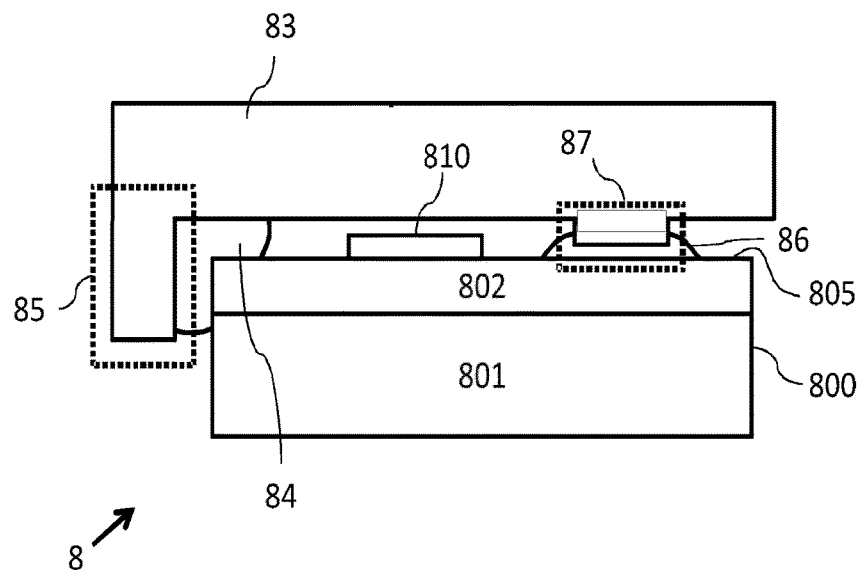
FIG. 8 illustrates an LED module according to a ninth exemplary embodiment.

Another embodiment of an LED module 8 is illustrated in FIG. 8. As before, the LED module comprises a PCB 800 having a first layer 801 and a second layer 802. A optically transmissive cover plate 83 is positioned to cover at least one LED 810 (positioned on an upper surface 805 of the PCB 800) and comprises a first protrusion 85 arranged to cover a portion of an interface between the first layer 801 and the second layer 802 at a side surface of the PCB 800. Sealant 84 is positioned between the first protrusion 85 and the side surface of the printed circuit board such that the portion of the interface between the first layer 801 and the second layer 802 covered by the protrusion is sealed against foreign contaminants.

The present embodiment, however, further comprises an additional protrusion 87. The additional protrusion protrudes outwardly from the cover plate to cover a section of the upper surface 805 of the PCB 800. Additional sealant 86 is provided between the additional protrusion 87 and the upper surface 805 of the PCB 800 to seal the optical plate 83 to the printed circuit board 87. The sealant may be adhesive, and thereby fix the optical plate to the upper surface of the PCB 800. The additional sealant may be called an upper surface sealing protrusion. By providing at least one such upper surface sealing protrusions, an area of the upper surface of the printed circuit board, which may contain at least one LED 810, may be protected against the ingress of foreign contaminants.

Figure 9:
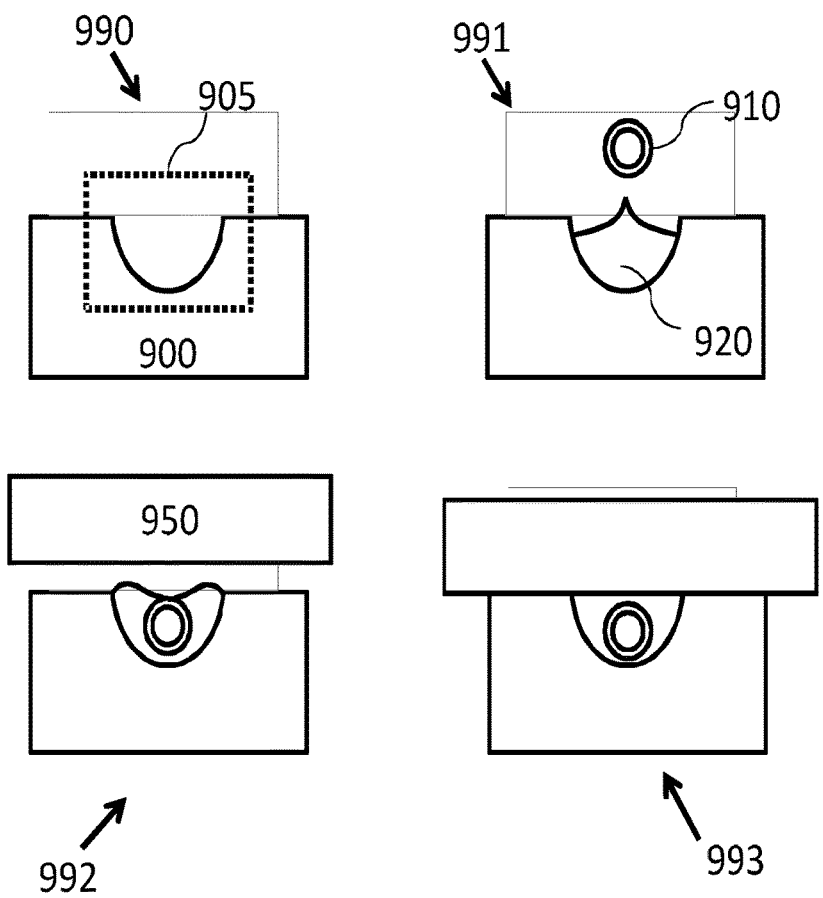
FIG. 9 illustrates a technique for providing electrical connection to the printed circuit board through the optical plate.

Presented in FIG. 9 is a technique for providing a feed-through for wires through a protrusion 900 to allow, for example, provision of an external power supply to the LEDs. The exemplary protrusion 900 is an upper surface sealing protrusion, such as the additional protrusion 87. This should not be construed as limiting the feed-through of wires to only apply to an upper surface sealing protrusion, but may rather also apply to the side-sealing protrusions such as those embodied in FIGS. 1-7.

For provision of wires through the protrusion 900—a cavity 905, for example a channel or depression, is provided 990 in the protrusion. Such a cavity spans across the width of the protrusion, for example, in a substantially perpendicular direction to that of the length of the protrusion. Optionally, the cavity 905 may have a variable width over the length of the said cavity. Sealant 920 is provided 991 in the cavity, to which a wire 910 is sunk. A printed circuit board 950 is provided 992 and brought into contact 993 with the protrusion 900. The sealant thereby seals the wire 910 within the cavity 920, and partially seals the circuit board 950 to the protrusion 900. In the present embodiment there is only sufficient sealant 920 to completely fill the cavity 905 such that within the cavity 905 (including the wire 910) there are no gaps or voids. Thus wires may be provided to the printed circuit board from an external (to the present LED module) interface.

Figure 10:
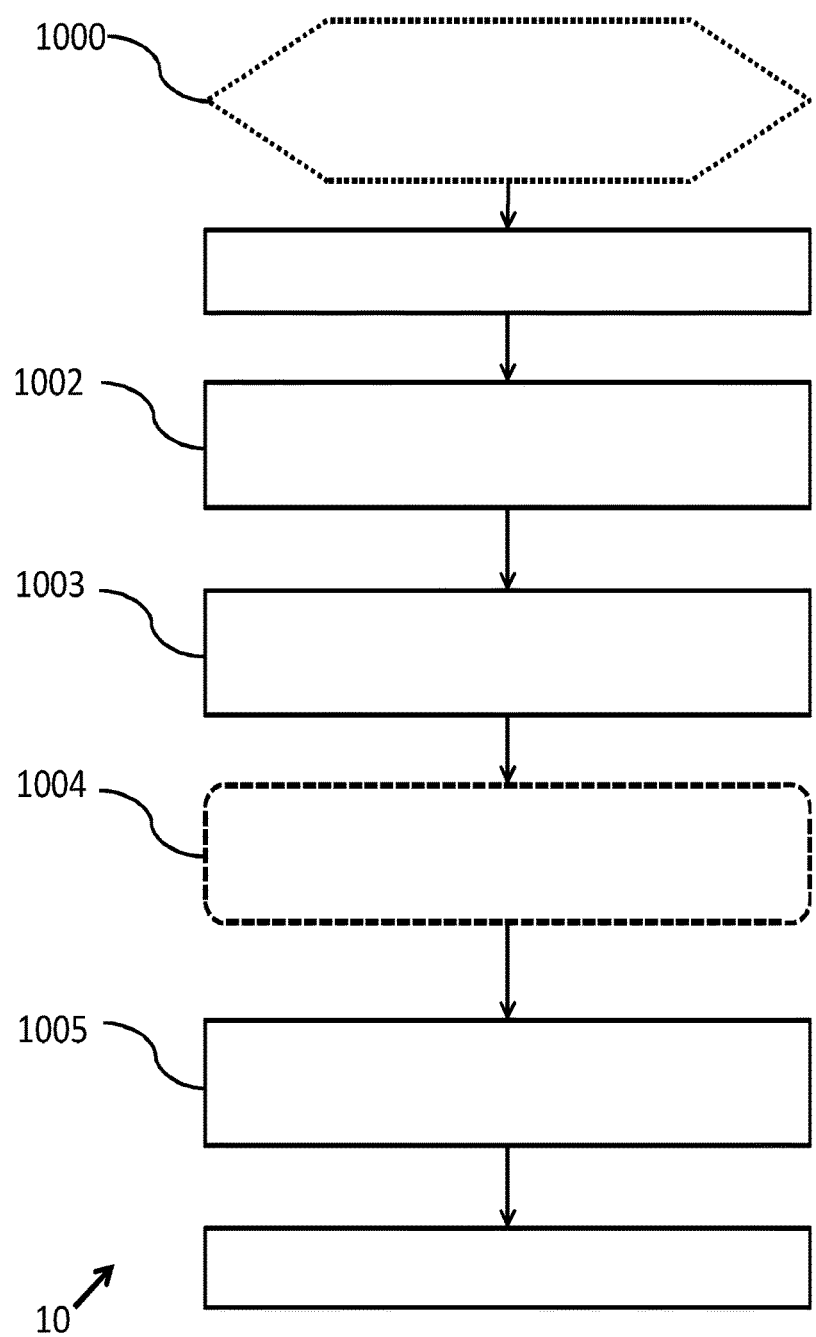
FIG. 10 depicts a flowchart for a herein disclosed method of sealing an LED module.

With reference to FIG. 10, a method 10 of sealing an LED module 1000 is illustrated. The method comprises: providing an optically transmissive cover plate comprising translucent material positioned 1002 to cover at least one of the plurality of LEDs and comprising at least one protrusion arranged 1003 to cover a portion of an interface between the first layer and the second layer at the at least one side surface of the printed circuit board. The method may further comprise providing 1005 sealant between the protrusion of the cover plate and the covered interface so as to prevent ingress of foreign contaminants into the section of the interface between the first layer and the second layer covered by the covered area. An additional optional method step comprises providing 1004 at least one depression in the optical plate alongside each protrusion and providing sealant in the depression of the optical plate for sealing of the optical plate to the printed circuit board.

Figure 11:
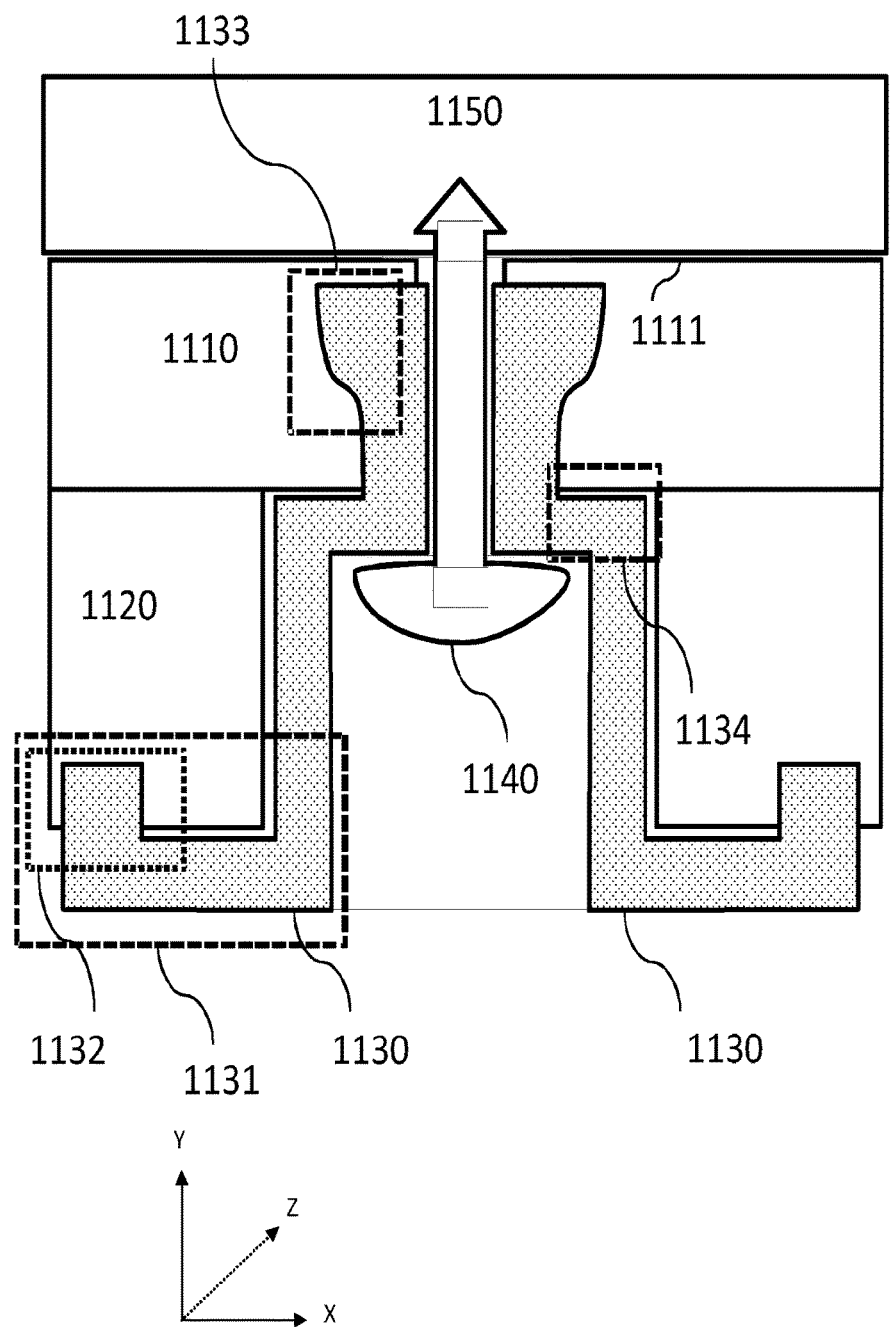
FIG. 11 shows a mechanically fastening plug for mounting an LED module to an external support according to an embodiment.

A cross-section of one embodiment of a mechanical fixation plug 1130 for securing the LED module 1110, 1120 into an external support 1150 is shown in FIG. 11. The LED module comprises the printed circuit board 1110 and the optical plate 1120, which in this embodiment lie substantially flat and flush against one another.

The plug 1130 spans through both the printed circuit board 1110 and the optical plate 1120 without extending beyond a bottom surface 1111 of the printed circuit board. A mechanical fastener 1140, for example a screw, is mountable within the plug for affixing the plug to the external support 1150 which may, for example, be a ceiling, wall or another part of the luminaire (such as a heatsink or housing).

To secure the plug to LED module, the plug 1130 comprises at least one clamp 1133 which may extend in a single direction (for example the X-direction along the length of the LED module). The plug 1130 has a press module 1134 for ensuring the bottom surface 1111 of the printed circuit board is made to lie substantially flat against the external support 1150. The mechanical screw 1140 applies direct pressure to the printed circuit board 1110, through the press module 1134, to perform this action. In embodiments the press module may extend in the Z-direction (i.e. into the page, at least partially spanning the width of the LED module). The plug 1130 further comprises at least one wing 1131 which spans across an exposed surface of the optical plate to mechanically secure the optical plate to the printed circuit board. The wing may comprise a wing protrusion or pin 1132 which projects into the optical plate for a more secure fastening. The optical plate may thus be pushed against the printed circuit board. In some embodiments the wing 1131, inclusive of a wing protrusion 1132, may be thought to function as a spring, and may permit movement in the Z-Direction and the X-direction (i.e. the direction corresponding to the width and length of the LED module), but may limit movement in the Y direction. Thus the optical plate 1120 may be kept a constant distance from the printed circuit board 1130.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An LED module comprising:
    a printed circuit board having an upper surface, a lower surface, and a side surface; the printed circuit board comprising a first layer; a second layer; and a plurality of LEDs adapted to output light from the upper surface; and
    an optically transmissive cover plate positioned to cover at least one of the plurality of LEDs and having at least one protrusion arranged to cover a portion of an interface between the first layer and the second layer at the side surface of the printed circuit board,
    wherein the first layer forms the lower surface of the printed circuit board, and comprises a first layer side surface that is at least partially inwardly inclined.

2. The LED module as claimed in claim 1, further comprising sealant positioned between the protrusion of the optical plate and the covered portion of the interface so as to prevent ingress of foreign contaminants into the said covered portion of the interface.

3. The LED module as claimed in claim 2, wherein the sealant is adapted to adhere the protrusion of cover plate to the covered portion of the interface.

4. The LED module as claimed in claim 1, wherein: the first layer comprises a metal substrate; and the second layer comprises a dielectric material.

5. The LED module of claim 1, wherein the optical plate further comprises at least one depression alongside the protrusion of the optical plate.

6. The LED module of claim 5, further comprising sealant positioned between the depression of the cover plate and the printed circuit board for sealing the cover plate to the printed circuit board.

7. The LED module of claim 1, wherein the protrusion has at least one inclined side.

8. The LED module of claim 1, wherein at least one layer is at least partially absent in the locality of the protrusion.

9. A method of sealing an LED module, wherein said LED module comprises a printed circuit board having an upper surface and at least one side surface and comprising: a first and second layer; and a plurality of LEDs adapted to output light from the upper surface, the method comprising:
    providing an optically transmissive cover plate comprising translucent material positioned to cover at least one of the plurality of LEDs and comprising at least one protrusion arranged to cover a portion of an interface between the first layer and the second layer at the at least one side surface of the printed circuit board;
    wherein the first layer forms the lower surface of the printed circuit board, and comprises a first layer side surface that is at least partially inwardly inclined.

10. The method as claimed in claim 9, further comprising: providing sealant between the protrusion of the cover plate and the covered interface so as to prevent ingress of foreign contaminants into the section of the interface between the first layer and the second layer covered by the covered area.

11. The method as claimed in claim 9, further comprising: providing at least one depression in the optical plate alongside each protrusion; providing sealant in the depression of the optical plate for sealing of the optical plate to the printed circuit board.

12. The method as claimed in claim 9, wherein the step of providing an optical plate is adapted wherein the protrusion has at least one inclined side.

13. The method as claimed in claim 9, wherein the second layer of the printed circuit board of the LED module is at least partially absent in the locality of the protrusion.

* * * * *